(12) United States Patent
Jeng (10) Patent No.: US 8,574,995 B2
(45) Date of Patent: Nov. 5, 2013

(54) SOURCE/DRAIN DOPING METHOD IN 3D DEVICES

(75) Inventor: Pei-Ren Jeng, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 13/293,679

(22) Filed: Nov. 10, 2011

(65) Prior Publication Data
US 2013/0122676 A1   May 16, 2013

(51) Int. Cl.
*H01L 21/331* (2006.01)
*H01L 21/336* (2006.01)

(52) U.S. Cl.
USPC ............ 438/358; 438/305; 438/306; 438/363

(58) Field of Classification Search
USPC ......... 438/142, 199, 201, 205, 206, 207, 217, 438/221, 222, 223, 224, 225, 226, 227, 228, 438/231, 232, 259, 267, 273, 274, 276, 278, 438/289, 290, 291, 298, 303, 306, 305, 358, 438/363; 257/288, 327, 328, 338, 350, 351
See application file for complete search history.

(56) References Cited

U.S. PATENT DOCUMENTS

| | | | |
|---|---|---|---|
| 5,976,939 A | 11/1999 | Thompson et al. | |
| 6,165,826 A * | 12/2000 | Chau et al. | 438/231 |
| 7,407,874 B2 | 8/2008 | Sasaki et al. | |
| 7,449,373 B2 | 11/2008 | Doyle et al. | |
| 2005/0059260 A1 * | 3/2005 | Bu et al. | 438/775 |
| 2006/0166422 A1 * | 7/2006 | Suenaga | 438/199 |
| 2007/0099369 A1 * | 5/2007 | Ning | 438/199 |
| 2007/0128786 A1 * | 6/2007 | Cheng et al. | 438/199 |

OTHER PUBLICATIONS

K. Takeuchi, T. Fukai, T. Tsunomura, A.T. Putra, A. Nishida, S. Kamohara and T. Hiramoto; "Understanding Random Threshold Voltage Fluctuation by Comparing Multiple Fabs and Technologies;" 2007; pp. 467-470; IEEE; 1-4244-0439-X; Japan.
Y. Sasaki, K. Okashita; K. Nakamoto; T. Kitaoka; B. Mizuno and M. Ogura; "Conformal Doping for FinFets and Precise Controllable Shallow Doping for Planar FET Manufacturing by a Novel $B_2H_6$/Helium Self-Regulatory Plasma Doping Process;" 2008; pp. 917-920; IEEE; 1-4244-2377-4; Japan.
Pei-Ren Jeng; "Doping Method in 3D Semiconductor Device;" U.S. Appl. No. 13/280,838, filed Oct. 25, 2011; 23 Pages.

* cited by examiner

Primary Examiner — Walter H Swanson
Assistant Examiner — Wilner Jean Baptiste
(74) Attorney, Agent, or Firm — Haynes and Boone, LLP (57) ABSTRACT

The present disclosure provides methods of semiconductor device fabrication for 3D devices. One method includes provide a substrate having a recess and forming a doping layer on the substrate and in the recess. The substrate is then annealed. The annealing drives dopants of a first type from the doping layer into the substrate. This can form a doped region that may be the source/drain extension of the 3D device. An epitaxial region is then grown in the recess. The epitaxial region can form the source/drain region of the 3D device.

20 Claims, 6 Drawing Sheets

SOURCE/DRAIN DOPING METHOD IN 3D DEVICES

BACKGROUND

The present disclosure relates generally to the field of fabrication of semiconductor devices, and more specifically to a method of fabricating a 3D CMOS device such as a fin-type field effect transistor (finFET), or a portion thereof.

Multiple-gate metal-oxide semiconductor field-effect transistors (MOSFETs) are MOSFETs that incorporate two or more gates into a single device. Some of these devices may be known as finFETs when their structure includes a thin "fin" extending from a substrate. Silicon based finFETs have been successfully fabricated using conventional MOSFET technology. A typical finFET is fabricated on a substrate with an overlying insulating layer with a thin 'fin' extending from the substrate, for example, etched into a silicon layer of the substrate. The channel of the FET is formed in this vertical fin. A gate is provided over (e.g., wrapping) the fin. The multiple gate structure is beneficial in that there is a gate on both sides of the channel allowing gate control of the channel from both sides. Further advantages of finFETs include reducing the short channel effect and higher current flow.

However, introducing the suitable dopants into the source/drain region including the source/drain extension region of a finFET device may be difficult. For example, challenges arise in ensuring conformal doping profile. Current processes can lead to random doping fluctuations, poor step coverage, and/or other issues. Additionally, in particular as geometries decrease, implementing a method of doping the fin of a transistor, which can be integrated with a process of doping the transistors of a different type may be difficult.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. FinFET as the term is employed in the current disclosure provides any 3D or fin-based transistor. A finFET element may include a finFET device (e.g., transistor) or any portion thereof (e.g., a fin). In addition, though described herein comprising certain elements, one skilled in the art would recognize the applicability of the present disclosure to other 3D devices.

Figure 1:
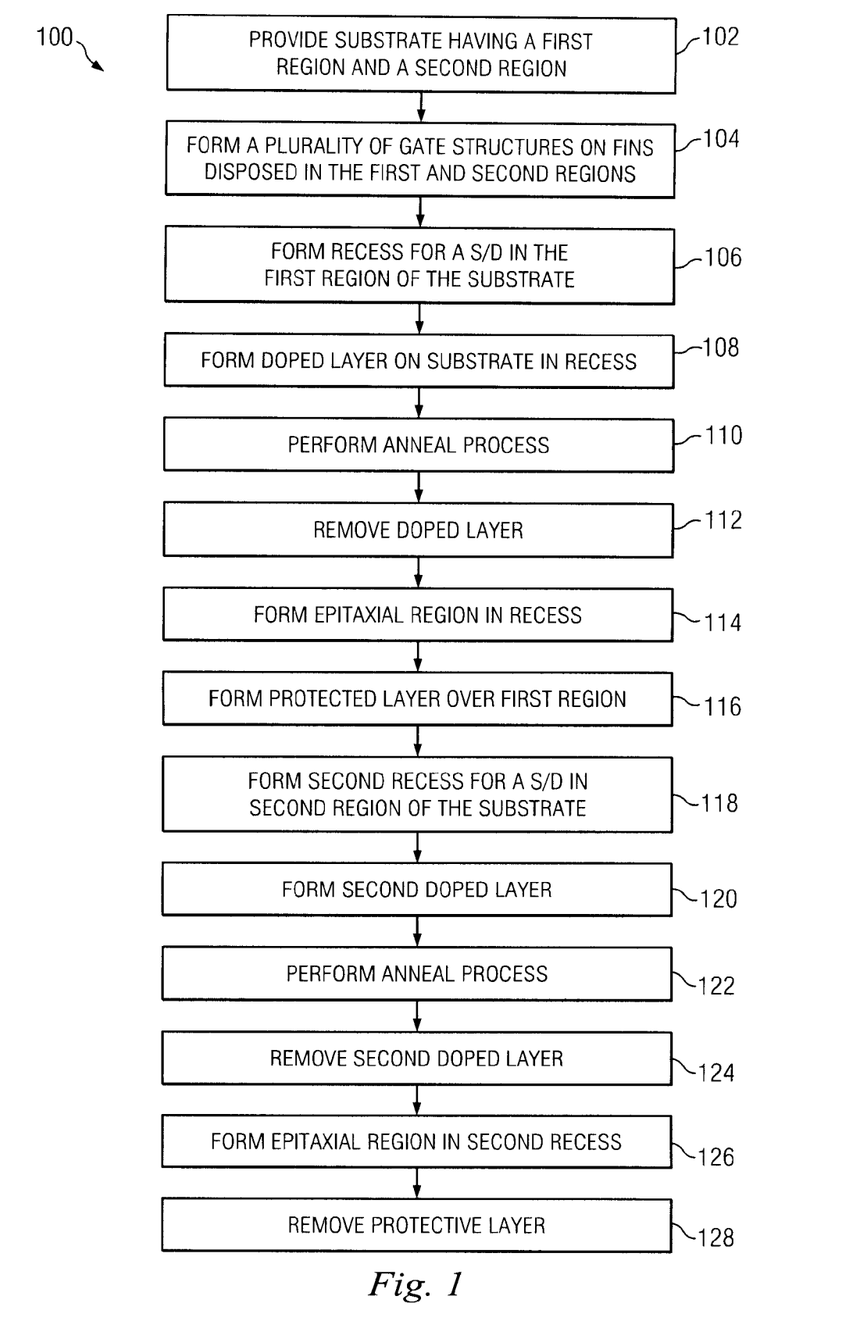
FIG. 1 illustrates a flow chart of an embodiment of a method to fabricate a finFET semiconductor device or portion thereof in accordance with the present disclosure.

Illustrated in FIG. 1 is a method of fabricating a 3D device or portion thereof. In particular, FIG. 1 illustrates a method 100 including doping a source/drain region of the device. It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the doping methods described herein.

FIGS. 2-11 are cross-sectional and perspective views, respectively, of an embodiment of semiconductor device 200 according to various stages of the method 100 of FIG. 1. It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of devices such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 begins at block 102 where a substrate is provided. The substrate has a first region and a second region. The first region may include a portion of the substrate configured to provide p-type semiconductor devices (e.g., pFET). The second region may include a portion of the substrate configured to provide n-type semiconductor device(s) (e.g., nFET). An isolating region may interpose the first and second region.

In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate. The SOI substrate may be fabricated using separation by implantation of oxygen (SIMOX), wafer bonding, and/or other suitable methods.

Figure 2:
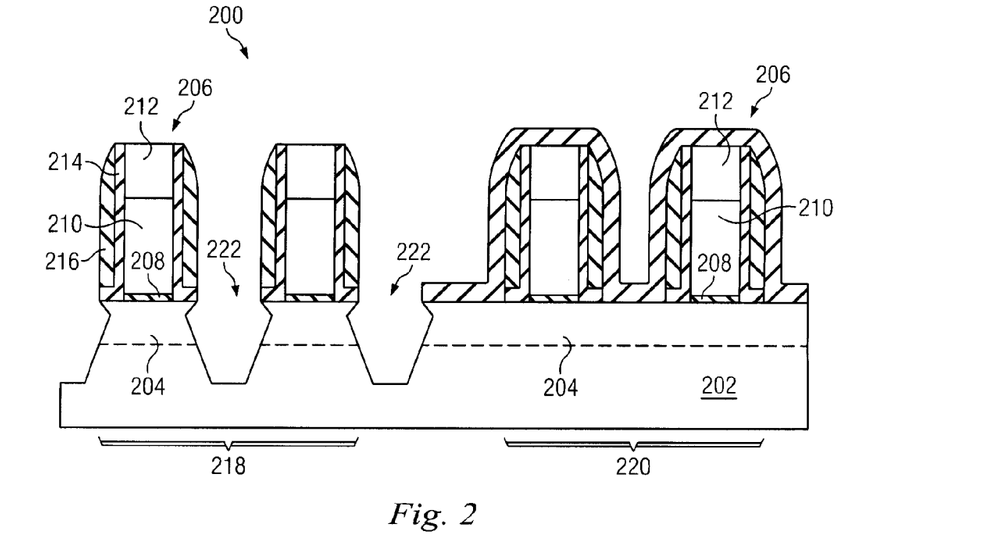
FIGS. 2 and 4-11 illustrate cross-sectional views of an embodiment of a 3D device 200 having a source/drain region doped according to one or more aspects of the method of FIG. 1.
Figure 3:
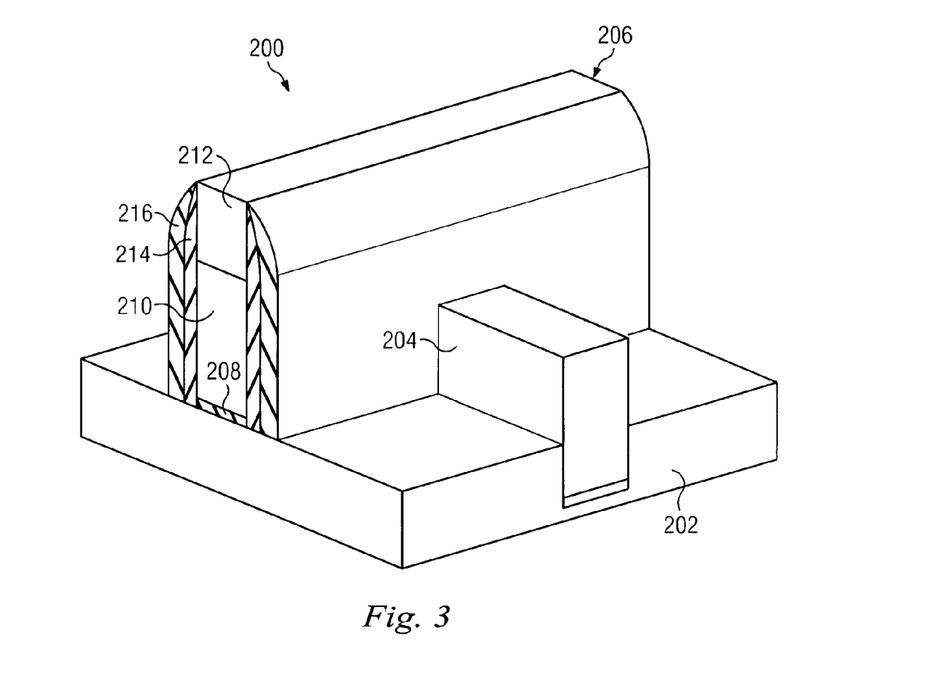
FIG. 3 illustrates a perspective view of an embodiment of the device 200, or portion thereof, which may be fabricated according to one or more aspects of the present disclosure.

Referring to the example of FIG. 2, a cross-sectional view of a device 200 is illustrated. The device 200 includes a substrate 202. In an embodiment, the substrate 202 includes silicon. FIG. 3 illustrates a portion of the device 200 in a perspective view.

The substrate may include a plurality fins disposed on the substrate. The fins may be fabricated using suitable processes including photolithography and etch processes. For example, the photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form a fin on a substrate may be suitable.

Referring to the example of FIGS. 2 and 3, fins 204 are disposed on the substrate 202. The fins 204 may include silicon.

The method 100 then proceeds to block 104 where a plurality of gate structures are formed on the substrate provided in block 102 of the method 100, e.g., on the fin. The gate structures may be finFet gate structures contacting a channel region (e.g., fin) on more than one surface. In an embodiment, the gate structures contact the channel region or fin at at least three surfaces. The gate structures may include gate dielectric layers, gate electrode layer(s), hard mask layer(s), spacer elements, and/or other features. In an embodiment, the gate structure includes one or more sacrificial layers such as provided in a replacement gate process. In an embodiment, the gate structure includes a polysilicon gate electrode. The gate dielectric layer may include silicon dioxide, high-k dielectric material, and/or other suitable materials.

Referring again to the examples of FIGS. 2 and 3, the device 200 includes a plurality of gate structures 206. The gate structures 206 include a gate dielectric layer 208, a gate electrode layer 210, a hard mask layer 212, and first and second spacer elements 214 and 216, respectively. Other gate structures are possible and within the scope of the present disclosure. In an embodiment, the gate electrode layer 210 is polysilicon. In an embodiment, the hard mask layer 212 may be silicon nitride, and/or other suitable materials. The spacer element(s) 214 and/or 216 may include dielectric material such as silicon nitride, silicon oxynitride, silicon oxide, and/or other suitable materials.

A portion of the plurality of gate structures 206 are formed in a first region 218 of the substrate 202. A portion of the plurality of gate structures 206 are formed in a second region 220 of the substrate 202. The gate structures 206 in the first region 218 may be associated with devices of a different type than the gate structures 206 in the second region 220, for example, the first region may include pFET devices and the second region may include nFET devices, or vice versa.

The method 100 then proceeds to block 106 where a recess is formed in the substrate. The recess may be adjacent the gate structure and provide a region wherein a source/drain region will be disposed. The recesses may be formed using reactive ion etch (RIE) and/or other suitable processes. In an embodiment, the recesses are diamond-shaped recesses.

Referring to the example of FIG. 2, illustrated are recesses 222. The recesses 222 may be referred to as strained source/drain regions. In an embodiment, the recesses 222 define a source/drain region for a PFET device.

The method 100 then proceeds to block 108 where a doped layer is formed on the substrate and in the recesses described above. The doped layer may be an oxide film having dopants of an n-type or p-type. In an embodiment, the doped layer is an oxide film including a boron dopant. The concentration of dopant in the doped layer may be between approximately 1 weight percent (wt %) and approximately 10 wt %. In a further embodiment, the concentration of dopant may be between approximately 2 wt % and approximately 4 wt %. The doped layer may have a thickness between approximately 1 nanometer (nm) and approximately 5 nm, though other embodiments are possible. In an embodiment, the doped layer is boro-silicate glass (BSG).

The doping film may be blanket-deposited by atomic layer deposition (ALD), plasma-enhanced ALD (PEALD), plasma enhanced chemical vapor deposition (PECVD) processes, and/or other suitable processes. One of more of these processes may use $B_2H_6$, $BF_3$, $PH_3$, $AsH_3$, and/or other suitable doping precursors.

Before the formation of the doped layer on the first region of the substrate, in embodiments of the method 100, the second region of the substrate may be protected by a protective layer. In an embodiment, the protective layer includes a nitride and/or oxide hard mask layer. In embodiments, a plurality of protective layers are provided. The protective layers may be chosen such that they are suitable to withstand high temperature processing.

Figure 4:
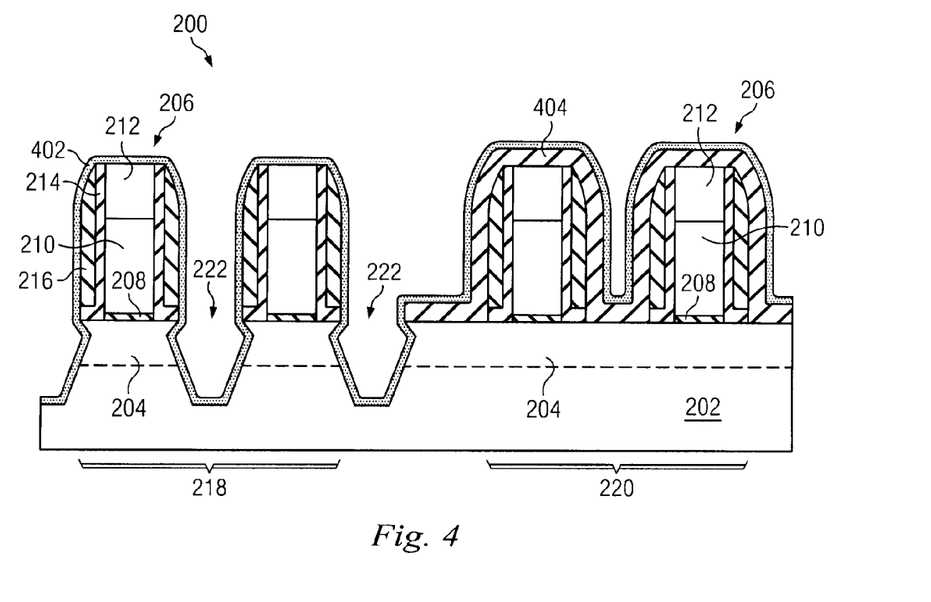

Referring to the example of FIG. 4, a doped layer 402 is formed on the substrate 202. The doped layer 402 is a conformal layer. The doped layer 402 lines the surfaces (or sidewalls) of the recess 222. The device 200 of FIG. 4 also illustrates a protective layer 404 formed on the second region of the substrate 220. The protective layer 404 may be a hard mask layer. The doped layer 402 may be an oxide film having dopants of an n-type or p-type. In an embodiment, the doped layer 402 is an oxide film including a boron dopant such as a BSG layer. The concentration of dopant in the doped layer may be between approximately 1 weight percent (wt %) and approximately 10 wt %. In a further embodiment, the concentration of dopant may be between approximately 2 wt % and approximately 4 wt %. The doped layer 402 may have a thickness between approximately 1 nm and approximately 5 nm, though other embodiments are possible.

The method 100 then proceeds to block 110 where a high temperature (e.g., anneal) process is performed. The anneal process may include a process temperature of between approximately 800 Celsius (C) and approximately 1400 C. The process dwell time (e.g., at temperature) may be between approximately 100 nanoseconds (nS) and 1.5 seconds (S). However, other process parameters are possible. In an embodiment, the high temperature process is a spike anneal.

The high temperature process of block 110 is operable to drive dopants from the doped layer into the substrate. For example, the anneal may drive dopants from the doped layer into the fin and/or substrate that the doped layer is disposed on.

Figure 5:
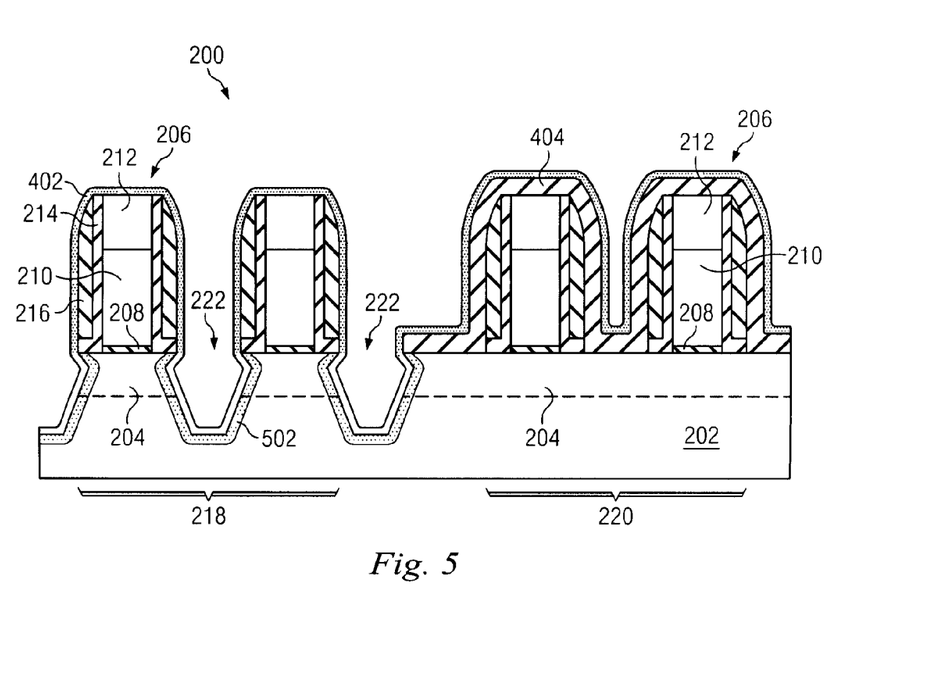

Referring to the example of FIG. 5, an anneal is performed which drives dopants from the doped layer 402 into the fin 204 (and substrate 202). Thus, regions of the substrate 202 and fin 204 defining the recess 222 (e.g., the recess sidewalls) are doped by anneal process driving dopants from the doped layer 402. This doped region is illustrated as doped region 502. In an embodiment, the doped region 502 includes silicon doped with a p-type dopant. In a further embodiment, the doped region 502 includes silicon doped with boron. In embodiments, dopants are also driven (e.g., simultaneously) from the doped layer 402 into other layers formed on the substrate 202 including the protective layer 404, the spacer elements 214 and 216, and the hard mask 221.

Figure 6:
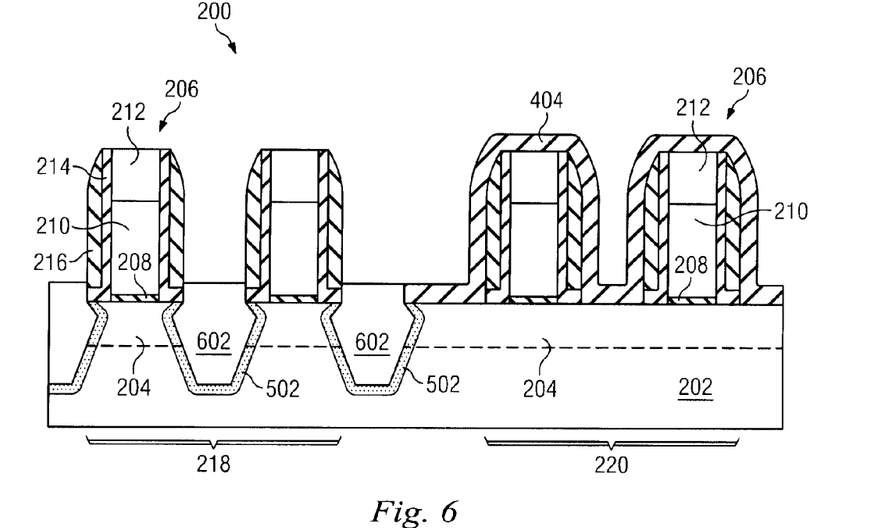

In an embodiment, the doped region 502 provides a source/drain extension region for a transistor. The doped region 502 may provide a lower concentration doping than the source/drain region (e.g., the epitaxial region 602).

The method 100 then proceeds to block 112 where the doped layer is removed from the substrate after the anneal process is completed. The doped layer may be removed by wet etch, dry etch, plasma etch, and/or other suitable processes.

The method 100 then proceeds to block 114 where an epitaxial region is formed on the substrate in the recesses described above with reference to block 106. The epitaxial region may be formed by epitaxial growth methods known in the art. In an embodiment, the epitaxial region is Si. However, other compositions are possible including Si:C, SiGe, and/or other suitable compositions. The epitaxial region may form a source/drain region for a semiconductor device. The epitaxial region is formed (e.g., grown) on the region of the substrate and/or fin doped by the doping layer. The epitaxial region may be stressed or strained. The epitaxial region may be suitably doped to depending on the configuration of the associated device.

Referring to the example of FIG. 6, an epitaxial region 602 has been formed in the recesses 222 (described above with reference to FIG. 2).

The method 100 then proceeds to block 116 where a protective layer is formed over the first region of the substrate. The protective layer may include silicon nitride. In an embodiment, a layer of material is deposited on the substrate and subsequently patterned to remove the protective material from the second region of the substrate. The patterning may be performed by suitable lithography and etch processes. In embodiments, the protective layer previously formed on the second region (above in block 108 and as layer 404 of FIG. 4) may be removed prior to the formation of the protective layer of block 116. In other embodiments, the protective layer of block 116 may be formed on the protective layer previously formed on the second region (above in block 108 and as layer 404 of FIG. 4) and both layers may be removed simultaneously during the patterning. The protective layer may include one or more layers of material.

Figure 7:
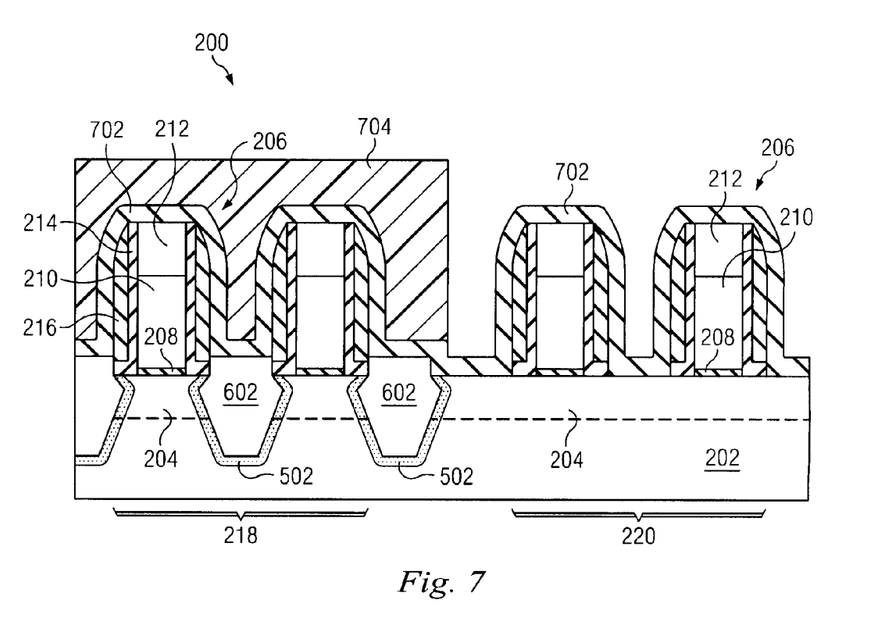

Referring to the Example of FIG. 7, a protective layer 702 is formed on the substrate 202. The protective layer 702 illustrates a conformal layer. A masking element 704 is formed on the protective layer 702 to mask the protective layer 702 in the first region 218 of the substrate 202 from removal. The masking element 704 may include photosensitive material such as photoresist. In embodiments, the masking element 704 may include additional layers such as antireflective coatings, hard masks, and/or other suitable layers in addition to or in lieu of the photoresist. The protective layer 702 is then removed from the second region 220 (see FIG. 8).

The method 100 then proceeds to block 118 where a plurality of recesses are formed in the substrate (e.g., in the second region of the substrate). The recess may be adjacent the gate structure and provide a region wherein a source/drain region will be disposed. The recesses may be formed using reactive ion etch (RIE) and/or other suitable processes.

Figure 8:
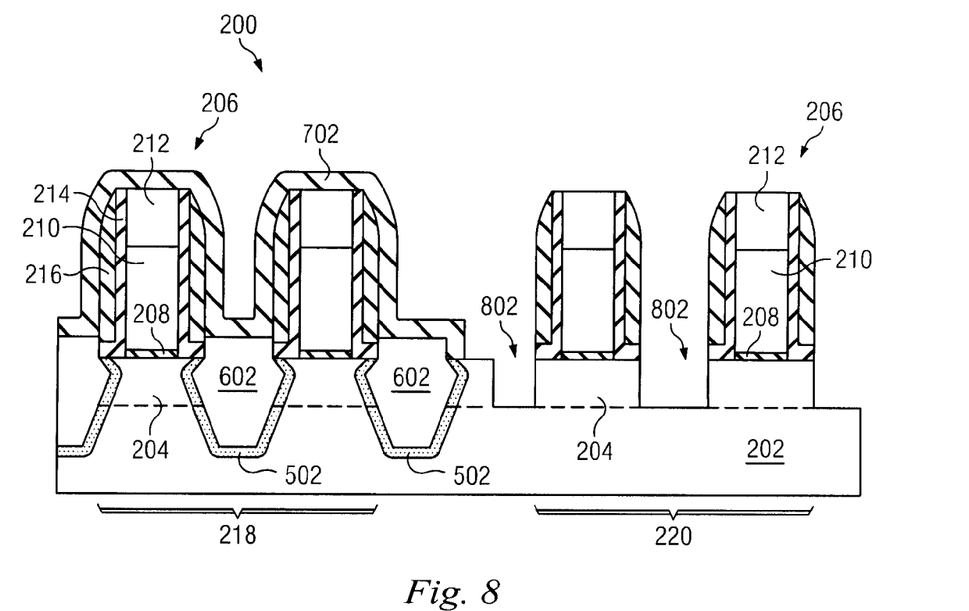

Referring to the example of FIG. 8, illustrated are recesses 802. The recesses 802 may be referred to as strained source/drain regions. In an embodiment, the recesses 802 define a source/drain region for a NFET device.

The method 100 then proceeds to block 120 where a doped layer (i.e., a second doped layer) is formed on the substrate and in the recesses described above with reference to block 118. The doped layer may be an oxide film having dopants of an n-type or p-type. The doped layer formed in block 120 of the method 100 may include dopants of the opposite type as the dopants of the doped layer of block 108 of the method 100 (e.g., p-type and n-type). In an embodiment, the doped layer is an oxide film including an n-type dopant. In an embodiment, the dopant is phosphorus. In other embodiments, the dopant may be arsenic and/or other suitable dopants. The concentration of dopant may be between approximately 1 wt % and approximately 10 wt %. In a further embodiment, the concentration of dopant may be between approximately 2 wt % and approximately 4 wt %. The doped layer may have a thickness between approximately 1 nm and approximately 5 nm, though other embodiments are possible. In an embodiment, the doped layer is phospho-silicate glass (PSG).

Figure 9:
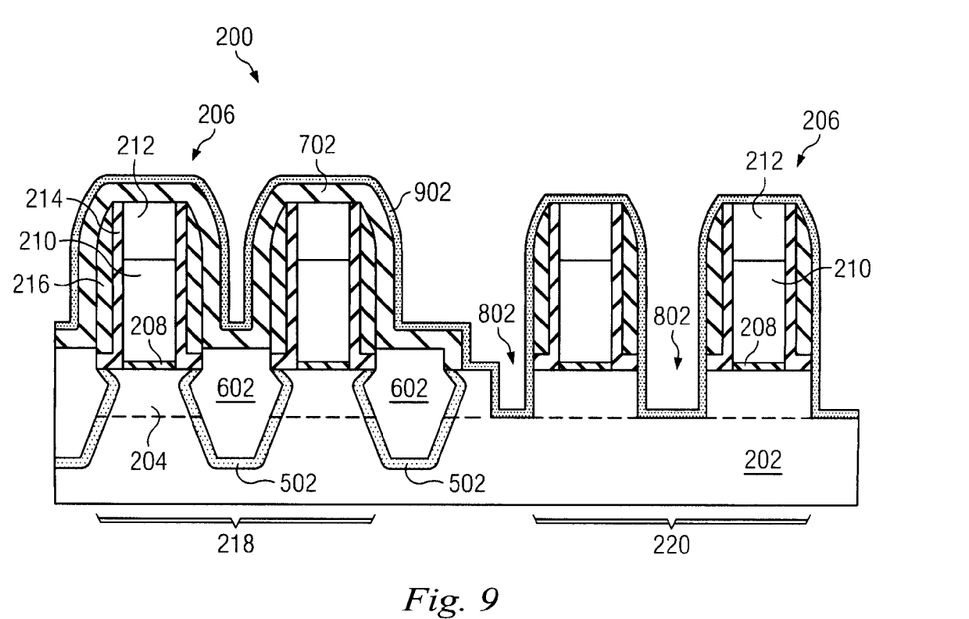

Referring to the example of FIG. 9, a doped layer 902 is formed on the substrate 202. The doped layer 902 is a conformal layer. The doped layer 902 lines the surfaces of the recess 802. The device 200 of FIG. 9 also illustrates a protective layer 702 formed on the first region 218 of the substrate 220. The doped layer 902 may be an oxide film having dopants of an n-type or p-type. In an embodiment, the doped layer 902 is an oxide film including a phosphorus dopant such as a PSG layer. The concentration of dopant may be between approximately 1 wt % and approximately 10 wt %. In a further embodiment, the concentration of dopant may be between approximately 2 wt % and approximately 4 wt %. The doped layer 902 may have a thickness between approximately 1 nm and approximately 5 nm, though other embodiments are possible. The dopant layer 902 may have the opposite dopant type as the doping layer 402.

The doping film 902 may be blanket deposited by atomic layer deposition (ALD), plasma-enhanced ALD (PEALD), plasma enhanced chemical vapor deposition (PECVD) processes and/or other suitable processes. One of more of these processes may use $B_2H_6$, $BF_3$, $PH_3$, $AsH_3$, and/or other suitable doping precursors.

The method 100 then proceeds to block 122 where a high temperature (e.g., anneal) process is performed. The anneal process may include a process temperature of between approximately 800 C. and approximately 1400 C. The process dwell time (e.g., at temperature) may be between approximately 100 nS and 1.5 S. However, other process parameters are possible. In an embodiment, the high temperature process is a spike anneal.

The high temperature process of block 122 is operable to drive dopants from the doped layer into the substrate. For example, the anneal may drive dopants from the doped layer into the fin and/or substrate that the doped layer is disposed on.

Figure 10:
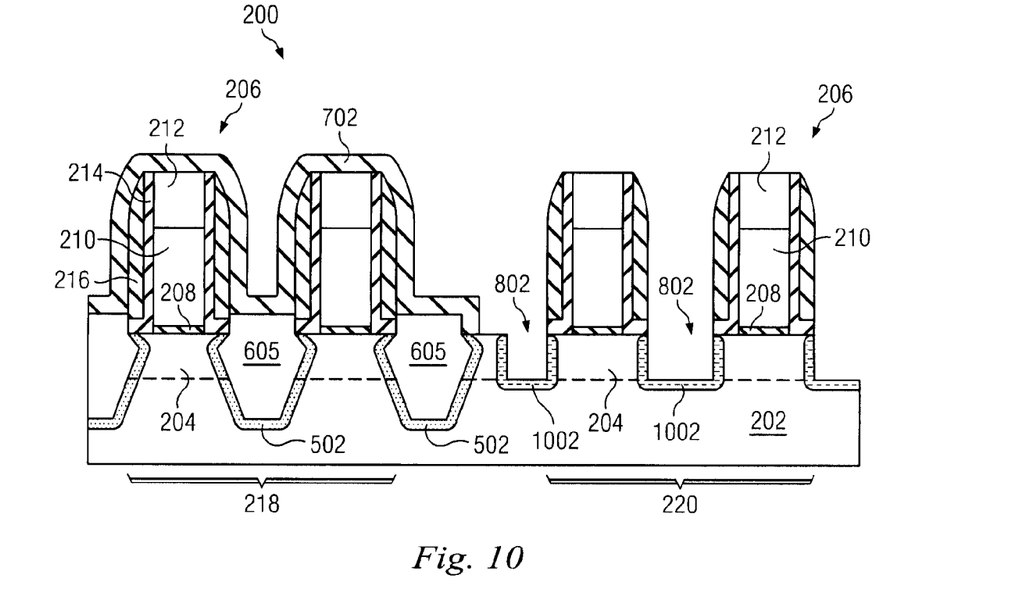

Referring to the example of FIG. 10, an anneal is performed which drives dopants from the doped layer 902 into the fin 204 (and substrate 202). Thus, regions of the substrate 202 and fin 204 defining the recess 802 (e.g., forming the sidewalls of the recess 802) are doped by anneal process driving dopants from the doped layer 902. This doped region is illustrated as doped region 1002. In an embodiment, the doped region 1002 includes silicon doped with an n-type dopant. In a further embodiment, the doped region 1002 includes silicon doped with phosphorus. In embodiments, dopants are also driven (e.g., simultaneously) from the doped layer 902 into other layers formed on the substrate 202 including the protective layer 702, the spacer elements 214 and 216, and the hard mask 221.

Figure 11:
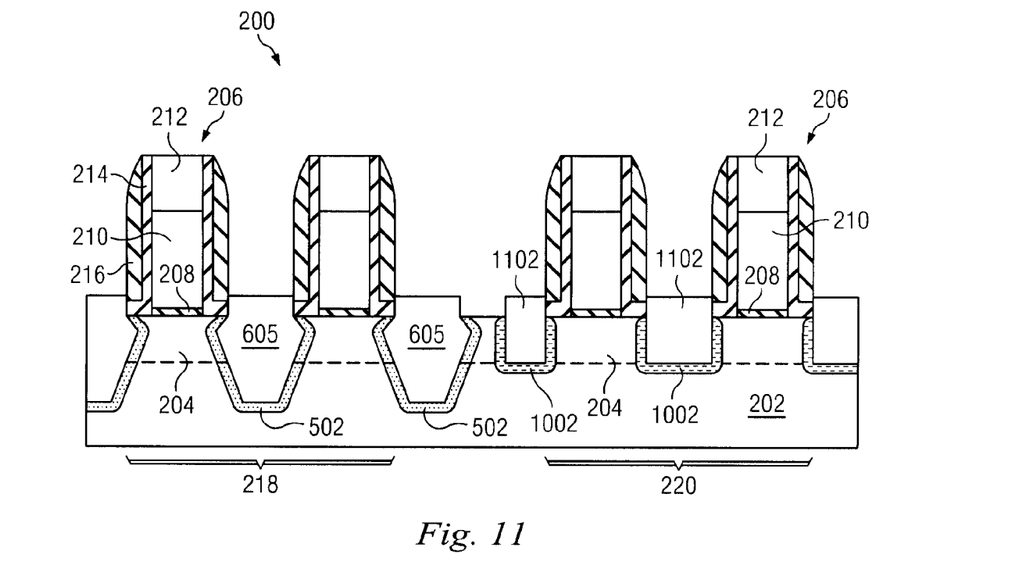

In an embodiment, the doped region 1002 provides a source/drain extension region for a transistor. The doped region 1002 may provide a lower concentration doping than the source/drain region (e.g., the epitaxial region 1102).

The method 100 then proceeds to block 124 where the doped layer is removed from the substrate after the anneal process is completed. The doped layer may be removed by wet etch, dry etch, plasma etch, and/or other suitable processes.

The method 100 then proceeds to block 126 where an epitaxial region is formed on the substrate in the recesses described above with reference to block 118. The epitaxial region may be formed by suitable epitaxial growth processes known in the art. In an embodiment, the epitaxial region is SiGe. However, other compositions are possible including SiC, Si, and/or other compositions known in the art. The epitaxial region may form a source/drain region for a semiconductor device. The epitaxial region is formed (e.g., grown)

on the region of the substrate and/or fin doped by the doping layer. The epitaxial region may be the same or differently composed than the epitaxial region described above with reference to block 114 of the method 100. The epitaxial region may be stressed or strained. The epitaxial region may be suitably doped to depending on the configuration of the associated device.

Referring to the example of FIG. 11, an epitaxial region 1102 has been formed in the recesses 802 (described above with reference to FIG. 8).

The method 100 then proceeds to block 128 where the protective element, formed above in block 116 of the method 100, is removed from the substrate. The protective layer may be removed by wet etch, dry etch, plasma etch, stripping, and/or other suitable processes. Referring to the example of FIG. 11, the protective layer 702 has been removed from the substrate 202, exposing the gate structures 206 in the first region 218 of the substrate 202.

It is understood that the method 100 may continue to include other aspects of CMOS device fabrication including formation of back-end-of-the-line (BEOL) features including interconnect lines, vias, and contacts.

In summary, the methods and devices disclosed herein provide for embodiments, which allow for a conformal doped film to introduce dopants into a region of a substrate. In particular, a source/drain region such as, a source/drain extension region, may be doped using the methods and doped films described herein. This can allow in embodiments for less damage to the substrate surface (e.g., in comparison to ion implantation). Embodiments of the present also allow for the improvement of the gradient junction. Still other advantages of some embodiments include the integration of doping the source/drain region of a NFET with the source/drain region of a PFET. It is further noted that the doping may be performed with a fewer number of photomasks as the doping by the doping layer is a self-aligned process.

Thus, the present disclosure provides methods of semiconductor device fabrication for 3D devices. One method includes provide a substrate having a recess and forming a doping layer on the substrate and in the recess. The substrate is then annealed. The annealing drives dopants of a first type from the doping layer into the substrate. This can form a doped region that may be the source/drain extension of the 3D device. An epitaxial region is then grown in the recess. The epitaxial region can form the source/drain region of the 3D device. The method may continue to form a second doping layer, in a second recess and again annealing the substrate. This annealing drives dopants of a second type from the second doping layer into the substrate. The dopant of the second type may be n-type (e.g., the first type may be p-type, or vice versa). The annealing may form a second doped region, which is used as a source/drain extension of a second 3D device (e.g., of an opposite type).

In another embodiment, a method of fabricating a 3D semiconductor device is described that includes providing a substrate having a fin, a gate structure of a first transistor disposed on the fin, and a recess adjacent the gate structure. A first doping layer is formed on the gate structure and in the first recess. The substrate and first doping layer are then annealed, which drives dopants from the first doping layer into the substrate to form a doped region. The doped region provides a source/drain extension region for the first transistor. An epitaxial region is grown in the first recess on the doped region, which provides a source/drain region for the first transistor.

What is claimed is:

1. A method, comprising:
   provide a substrate having a first recess formed in a first surface;
   depositing a first doping layer on and over the first surface of the substrate including on sidewalls of the first recess;
   annealing the substrate and first doping layer, wherein the annealing drives dopants of a first type from the first doping layer into the sidewalls of the first recess thereby providing a doped region of the substrate; and
   after annealing the substrate and first doping layer, growing an epitaxial region on the doped region of the substrate and in the first recess wherein the annealing drives dopants of a first type from the first doping layer through the sidewalls of the first recess to form a first doped region of the semiconductor substrate: forming a second doping layer on sidewalls of a second recess formed in the semiconductor substrate; and after forming the second doping layer, annealing the semiconductor substrate and second doping layer, wherein the annealing drives dopants of a second type, opposite the first type, from the second doping layer through the sidewalls of the second recess to form a second doped region of the semiconductor substrate.

2. The method of claim 1, further comprising:
   growing a second epitaxial region on the second doped region of the substrate and in the second recess.

3. The method of claim 1, wherein the epitaxial region forms at least one of a source and a drain of a field effect transistor (FET).

4. The method of claim 1, wherein the epitaxial region forms at least one of a source and a drain of a fin-type field effect transistor (finFET).

5. The method of claim 1, wherein the first type is p-type dopants.

6. The method of claim 1, wherein the first doping layer is phospho-silica glass (PSG).

7. The method of claim 1, wherein the first doping layer is boro-silica glass (BSG).

8. The method of claim 1, wherein the first doping layer includes between approximately 1 wt % and approximately 10 wt % of dopants of the first type.

9. A method, comprising:
   providing a semiconductor substrate having a first region having a first fin and a first gate structure formed on the first fin and a second region having a second fin and a second gate structure formed on the second fin;
   forming a first doping layer on sidewalls of a first recess formed in the first region of the semiconductor substrate, wherein the first recess is adjacent the first gate structure;
   after forming the first doping layer, annealing the semiconductor substrate and first doping layer, wherein the annealing drives dopants of a first type from the first doping layer into the first fin through the sidewalls of the first recess to form a first doped region of the semiconductor substrate;
   forming a second doping layer on sidewalls of a second recess formed in the second region of the semiconductor substrate, wherein the second recess is adjacent the second gate structure; and
   after forming the second doping layer, annealing the semiconductor substrate and second doping layer, wherein the annealing drives dopants of a second type, opposite the first type, from the second doping layer into the second fin through the sidewalls of the second recess to form a second doped region of the semiconductor substrate.

10. The method of claim 9, further comprising:
growing an epitaxial region on the first doped region and in the first recess after annealing the semiconductor substrate and the first doping layer, wherein the epitaxial region provides a source region for a transistor including the first gate structure.

11. The method of claim 9, further comprising:
growing an epitaxial region on the second doped region and in the second recess after annealing the semiconductor substrate and the second doping layer, wherein the epitaxial region provides a source region for a transistor including the second gate structure.

12. The method of claim 9, further comprising:
forming a hard mask layer on the second region of the semiconductor substrate prior to forming the first doping layer, and wherein the first doping layer is formed on the hard mask layer.

13. The method of claim 9, further comprising:
after annealing the semiconductor substrate and first doping layer, removing the first doping layer; and
forming a hard mask layer on the first region of the semiconductor substrate prior to forming the second doping layer, and wherein the second doping layer is formed on the hard mask layer.

14. The method of claim 9, further comprising:
removing the first doping layer prior to forming the second doping layer;
removing the second doping layer; and
forming an epitaxial region in the second recess after removing the second doping layer.

15. The method of claim 9, wherein the forming the first doping layer includes performing at least one of atomic layer deposition (ALD), plasma-enhanced ALD (PEALD), and plasma enhanced chemical vapor deposition (PECVD) processes.

16. The method of claim 9, wherein the dopants of the first type are boron.

17. The method of claim 16, wherein the dopants of the second type are phosphorus.

18. A method of fabricating a 3D semiconductor device, comprising:
provide a substrate having a first fin, a first gate structure of a first transistor disposed on the first fin, and a first recess adjacent the first gate structure a second fin, a second gate structure of a second transistor disposed on the second fin, and a second recess adjacent the second gate structure;
forming a first doping layer on the first gate structure and in the first recess;
annealing the substrate and first doping layer, wherein the annealing drives dopants from the first doping layer into the substrate to form a first doped region, wherein the first doped region provides a source/drain extension region for the first transistor; and
growing an epitaxial region in the first recess on the first doped region, wherein the epitaxial region provides a source/drain region for the first transistor forming a second doping layer on the second gate structure and in the second recess; and after forming the second doping layer, annealing the semiconductor substrate and second doping layer, wherein the annealing drives dopants of a second type, opposite the first type, from the second doping layer into the second fin through sidewalls of the second recess to form a second doped region of the semiconductor substrate.

19. The method of claim 18, wherein the second doped region provides a source/drain extension region for the second transistor; and
growing a second epitaxial region in the second recess on the second doped region, wherein the second epitaxial region provides a source/drain region for the second transistor.

20. The method of claim 19, wherein the first transistor is a p-type transistor and the second transistor is an n-type transistor.

* * * * *